(12) United States Patent
He et al.

(10) Patent No.: US 12,112,101 B2
(45) Date of Patent: Oct. 8, 2024

(54) DUAL PHYSICALLY-DRIVEN AND DATA-DRIVEN METHOD FOR RECONSTRUCTING INTERNAL RESPONSE OF BRIDGE

(71) Applicant: HEFEI UNIVERSITY OF TECHNOLOGY, Anhui (CN)

(72) Inventors: Wenyu He, Hefei (CN); Wenhan Chen, Hefei (CN); Dongyang Hu, Hefei (CN); Yifan Li, Hefei (CN); Zhidong Li, Hefei (CN); Zuocai Wang, Hefei (CN); Jing Zhang, Hefei (CN)

(73) Assignee: HEFEI UNIVERSITY OF TECHNOLOGY, Hefei (CN)

( * ) Notice: Subject to any disclaimer, the term of this patent is extended or adjusted under 35 U.S.C. 154(b) by 0 days.

(21) Appl. No.: 18/410,994

(22) Filed: Jan. 11, 2024

(65) Prior Publication Data

US 2024/0289508 A1   Aug. 29, 2024

(30) Foreign Application Priority Data

Feb. 22, 2023  (CN) .......................... 202310171567.4

(51) Int. Cl.
*G06F 30/13* (2020.01)
*G06F 17/16* (2006.01)

(52) U.S. Cl.
CPC .............. *G06F 30/13* (2020.01); *G06F 17/16* (2013.01)

(58) Field of Classification Search
CPC .......... G01M 5/00; G01M 7/02; G01M 13/00; G06F 17/13; G06F 17/16; G06F 17/50;
(Continued)

(56) References Cited

FOREIGN PATENT DOCUMENTS

| CN | 102539098 A | 7/2012 |
|---|---|---|
| CN | 109946389 A | 6/2019 |

(Continued)

OTHER PUBLICATIONS

CN 110046379 A (Year: 2019).*
(Continued)

*Primary Examiner* — Shawkat M Ali
(74) *Attorney, Agent, or Firm* — Porus IP LLC

(57) ABSTRACT

Disclosed is a dual physically-driven and data-driven method for reconstructing internal response of a bridge. The method includes: obtaining acceleration response by an acceleration sensor under an action of an unknown load of the bridge; embedding a physical logic into a neural network based on a frequency response function; putting a physical formula and corresponding boundary conditions and initial conditions into a loss function as penalty terms, and limiting a space of a feasible solution accordingly; and training a neural network model, and predicting acceleration of an unknown point by inputting an acceleration response set of a known point obtained by the sensor into the network. The formula is solved by converting direct solving of a control formula into optimization of the loss function, such that the problems that the internal response of the bridge is difficult to measure and excessively depends measured data can be effectively solved, and accuracy and robustness of internal response prediction of the bridge can be improved.

3 Claims, 9 Drawing Sheets

(58) Field of Classification Search
CPC .......... G06F 18/24; G06F 30/13; G06F 30/20; G06F 30/23; G06F 30/27; G06F 119/14; G06K 9/00; G06K 9/62; G06N 3/00; G06N 3/02; G06N 3/04; G06N 3/08; G06N 3/006; G06N 3/048; G06N 3/0464
USPC ....................................................... 703/1, 2
See application file for complete search history.

(56) References Cited

FOREIGN PATENT DOCUMENTS

| CN | 110046379 A | * | 7/2019 | ......... G06F 17/5004 |
|---|---|---|---|---|
| CN | 113010954 A | * | 6/2021 | |
| CN | 115688253 B | * | 3/2023 | |

OTHER PUBLICATIONS

CN 113010954 A (Year: 2021).*
CN 115688253 B (Year: 2023).*
Notification to Grant Patent Right for Invention in Chinese Application No. 202310171567.4 mailed on Aug. 8, 2023, 6 pages.
Yang, Jianxi et al., Research on Bridge Structural Damage Detection Based on Convolutional and Long Short-Term Memory Neural Networks, Journal of Railway Science and Engineering, 17(8): 1893-1902, 2020.

* cited by examiner

DUAL PHYSICALLY-DRIVEN AND DATA-DRIVEN METHOD FOR RECONSTRUCTING INTERNAL RESPONSE OF BRIDGE

CROSS-REFERENCES TO RELATED APPLICATIONS

This application claims priority of Chinese Patent Application No. 202310171567.4, filed on Feb. 22, 2023, the content of which is entirely incorporated herein by reference.

TECHNICAL FIELD

The present disclosure relates to the field of bridge structural health monitoring, and in particular to a method for reconstructing internal response of a bridge.

BACKGROUND

For a recent decade, reconstruction of structural internal response has attracted extensive attention. For comprehensive diagnosis and prediction of an engineering structure, it is necessary to accurately estimate a health status of an internal key part of the structure to determine a maintenance plan accordingly. Response of an internal point of the structure is unreachable, i.e., a sensor cannot measure the internal response of the structure. Accordingly, it is particularly important to develop a method for predicting, in an operation state, the internal response of the structure that is impossible to directly measure. For structural engineering, a virtual sensor method collects some physical variables that are easy to measure, and computes values of other physical variables to be monitored through processing of the physical variables. According to the idea of virtual sensor, response of a position that is difficult to measure can be predicted using response of some measurable structural positions, such that the problem that response of a target position cannot be measured directly in the operation state can be solved.

The above problems can be solved through two main modeling methods, i.e. physics/formula-based modeling and data-driven machine learning. A model-based method assumes availability of an accurate system model, while a data-driven method is based on machine learning. The two methods both have some limitations. The physics/formula-based modeling models a process to be monitored based on knowledge of a pre-known mechanism. However, in a practical application, despite of the knowledge of the entire model, it is still difficult to establish a complete mechanism model based on the prior knowledge. Firstly, it is difficult to establish a very accurate mechanism model since the entire model structure is very complicated. In addition, there may be numerous uncertainties during operation, which makes the mechanism model difficult to use for solving practical engineering problems. The data-driven virtual sensor performs analysis and regression by sorting and processing collected historical data. It is efficient to perform model training through a vast amount of data without deep understanding of an original system. However, due to discreteness of input parameters and output variables of the system, the data can never be complete, and a state space cannot be filled with the data despite of cost of data obtaining. As a result, a gap between the system and the data generated by the system is ineradicable in the data-driven model. Therefore, the model often fails except for the training data. An actual prediction result of the response is inaccurate due to a lack of inference.

SUMMARY

In order to solve the disadvantages in the prior art, the present disclosure provides a dual physically-driven and data-driven method for reconstructing internal response of a bridge, through which the problems that the internal response of the bridge is difficult to measure and excessively depends measured data can be effectively solved, and accuracy and robustness of internal response prediction of the bridge can be improved.

In order to achieve the above objective, the present disclosure uses the following technical solution.

The dual physically-driven and data-driven method for reconstructing the internal response of the bridge may include the following steps.

Step 1, arranging sensors on m nodes of the bridge, respectively, where the sensors are configured to collect acceleration response of the bridge;

Step 2, modeling the bridge by using a finite element model to obtain the finite element model of the bridge, applying a random load to the finite element model of the bridge, and obtaining an acceleration response matrix $\ddot{X}_k=[u_1, u_2, \ldots u_i, \ldots u_m]^T$ of m external nodes and a frequency response function matrix $H^k=[H_1, H_2, \ldots H_i, \ldots H_m]^T$ thereof, and an acceleration response matrix $\ddot{X}_u=[u_1', u_2', \ldots u_j', \ldots u_n']^T$ of n internal nodes of the bridge and a frequency response function matrix $H^u=[H_1', H_2', \ldots H_j', \ldots H_n']^T$ thereof, wherein $u_i$ denotes acceleration response with a length of w at an $i^{th}$ external node, $u_j'$ denotes acceleration response with a length of w at a $j^{th}$ internal node, $H_j$ denotes frequency response with a length of w at an $m^{th}$ external node, $H_j$ denotes frequency response with a length of w at a $n^{th}$ internal node, let a total acceleration response set be $\ddot{X}=\{\ddot{X}_k, \ddot{X}_u\}$, and let a total frequency response function set be $H=\{H^k, H^u\}$;

Step 3, constructing a convolutional neural network (CNN) model sequentially including an input layer, a convolutional layers, a–1 maximum pooling layers, e fully connected layers, and an output layer, adding a maximum pooling layer between two adjacent convolutional layers, and using a relu activation function between the fully connected layers;

inputting $\ddot{X}_k$ as an input set into the convolutional neural network, sequentially performing convolution and pooling by a convolutional layers and a–1 maximum pooling layers that are cross-connected, and outputting a feature vector with a dimension of b×c×d from an $a^{th}$ convolutional layer; where b denotes a number of channels for signal input, c denotes a number of channels for convolution generation, and c denotes a size of a convolution kernel;

flattening a feature vector set with a dimension of b×c×d, and obtaining a feature vector set with a dimension of b×c; and sequentially processing the feature vector set with the dimension of b×c by the e fully connected layers, and obtaining an internal node response prediction vector with a dimension of w×n expressed as $\ddot{X}_{net}$;

Step 4, constructing a difference function;

Step 4.1: performing dimensionality reduction on acceleration responses in $\ddot{X}_k$, performing Fourier transform, and obtaining acceleration response matrices $\ddot{X}_k(w)=$ $[u_1(w), u_2(w), \ldots, u_i(w), \ldots u_m(w)]^T$ of m external nodes on a frequency domain with a dimension of m×w, wherein $u_i(w)$ denotes acceleration response on a frequency domain with a length of w at an $i^{th}$ node;

Step 4.2, performing Fourier transform on $\ddot{X}_{net}$, and obtaining a prediction vector $\ddot{X}_{net}$ $(w)=[u_1'(w), u_2'(w), \ldots, u_j'(w), \ldots, u_n'(w)]^T$ of n internal response nodes on a frequency domain with a dimension of n×w, wherein $u_j'(w)$ denotes acceleration response on a frequency domain with a length of w at a $j^{th}$ internal node predicted by the network;

Step 4.3: constructing a relation formula between external node response and internal node response in structural dynamics by formula (1):

$$\begin{cases} \ddot{X}_{net}(w) = T_{aku}(\omega)\ddot{X}_k(\omega) \\ T_{aku}(\omega) = H^u(H^k)^+ \end{cases} \quad (1)$$

wherein in formula (1), $T_{aku}(\omega)$ denotes a transfer matrix, performing pseudo-inverse multiplication on an acceleration frequency response function matrix $H^u$ of an internal node and an acceleration frequency response function matrix $H^k$ of an external node, obtaining a true acceleration response transfer matrix $T_{aku}(w)$, and computing a difference f by formula (2):

$$f=\ddot{X}_{net}(w)-T_{aku}(\omega)\ddot{X}_k(w) \quad (2)$$

Step 4.4, performing pseudo-inverse multiplication on $\ddot{X}_{net}(w)$ and $\ddot{X}_k(w)$, and obtaining a predicted acceleration response transfer matrix $T_{net}(w)=[a_1(w), a_2(w), \ldots, a_j(w), a_m(w)]$; wherein $a_j(w)$ denotes an acceleration response transfer function with a length n at a $j^{th}$ external node; and computing a difference T by formula (3):

$$T=T_{net}(w)-T_{aku}(\omega) \quad (3)$$

Step 5: generating a total loss $L_{a11}$ of the CNN by formula (4):

$$L_{a11}=L_1+L_2+L_3+L_4 \quad (4)$$

where in formula (4), $L_1$ denotes a first loss and is obtained by formula (5), $L_2$ denotes a second loss and is obtained by formula (6), $L_3$ denotes a third loss and is obtained by formula (7), and $L_4$ denotes a fourth loss and is obtained by formula (8);

$$L_1=(f-f_0)^T(f-f_0) \quad (5)$$

$$L_2=(T-f_0)^T(T-f_0) \quad (6)$$

$$L_3=(\ddot{X}_{net0}-\ddot{X}_0)^T(\ddot{X}_{net0}-\ddot{X}0) \quad (7)$$

$$L_4=(\ddot{X}_{net}-\ddot{X}_u')^T(\ddot{X}_{net}-\ddot{X}_u') \quad (8)$$

where in formulas (5)-(8), $f_0$ denotes an all-zero matrix with a dimension of n×w, $\ddot{X}_{net0}$ denotes predicted response output by an acceleration response matrix under an initial condition through the CNN model, let the acceleration response matrix under the initial condition be an all-zero matrix with a dimension of w×1× m, and $\ddot{X}_0$ denotes acceleration response of Xy under the initial condition; and Step 6: based on the total acceleration response set $\ddot{X}=\{\ddot{X}_k, \ddot{X}_u\}$ and the total frequency response function set $H=\{H^k, H^u\}$, training the CNN model with an Adam optimizer, computing a total loss $L_{a11}$ and updating network parameters until a maximum training time is reached or the total loss $L_{a11}$ converges, and obtaining a trained CNN for reconstructing response of any internal node of the bridge.

The present disclosure provides an electronic device, including a memory and a processor. The memory may be configured to store programs supporting the processor in execution of the method for reconstructing internal response of a bridge. The processor may be configured to execute the programs stored in the memory.

The present disclosure provides a non-transitory computer-readable storage medium, storing computer programs that, when executed by a processor, may direct the processor to execute the steps of a method for reconstructing internal response of a bridge. Compared with the prior art, the present disclosure has the following beneficial effects.

1. Compared with traditional physical modeling, the present disclosure reduces requirements for model accuracy, constructs a relation between the external point and the internal point of the structure by using the physical logic under the condition of an incomplete mechanism model, and corrects the reconstructed internal response based on the data of the external point. In addition, benefited by a determined physical relation, the hybrid drive model has more accurate and reliable results in the case of complex engineering problems.

2. Compared with the data-driven machine learning, the present disclosure supplements the data driving with physical constraints, and adds physical laws such as control formulas to the loss function, such that dependence of the network on tag data is reduced and a generalization capacity and an application value are greatly improved. As for prediction results, the physical logic limits the space of the feasible solution, such that the model can converge quickly with few iterations, more accurate predicted values can be obtained in the case of problems such as missing data and too concentrated data in practical projects, and more accurate response results can be obtained in the case of complex loads.

DETAILED DESCRIPTION

Figure 1:
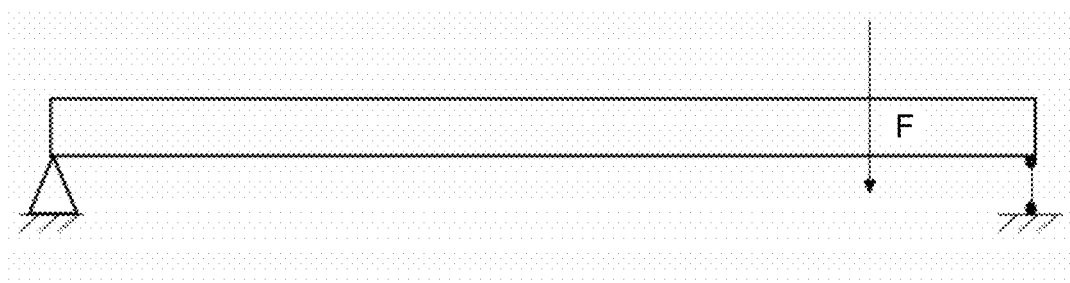
FIG. 1 is a schematic diagram illustrating a front view of a numerical simulated simply supported beam bridge model according to the present disclosure.

In Example 1, a bridge may have a span length of 50 m, a width and a height of 10 m, an elastic modulus of 21 Gpa, and a mass per linear meter of 7800 kg/m. When a finite element method is used for simulation, the bridge may be divided into hexahedral elements. A dual physically-driven and data-driven method for reconstructing internal response of a bridge can avoid the phenomenon that prediction of internal acceleration response of a structure is inaccurate or deviated due to insufficient precision of a finite element model and a lack of training data. By embedding a physical model into a neural network and limiting a space of a feasible solution with a physical logic, quick convergence can be achieved with few iterations, more accurate results can be obtained for different structures and accurate response results can also be obtained in the case of complex loads. Specifically, a principle of the method for reconstructing the internal response of the bridge may use a simply supported beam bridge model as shown in FIG. 1. The method may include the following steps.

Step 1, sensors may be arranged on m=2 nodes of the bridge, respectively, where the sensors may be configured to collect acceleration response of the bridge.

Step 2, the bridge may be modeled by using a finite element model to obtain the finite element model of the bridge, a random load may be applied to the finite element model of the bridge, and an acceleration response matrix $\ddot{X}_k=[u_1, u_2]^T$ of 2 external nodes and a frequency response function matrix $H^k=[H_1, H_2]^T$ thereof, and an acceleration response matrix $\ddot{X}_u=[u_1']^T$ of n=1 internal mode of the bridge and a frequency response function matrix $H^u=[H_1']^T$ thereof may be obtained, where $u_1$ and $u_2$ denote acceleration responses with a length of w=32 at a first external node and a second external node, $u_1'$ denotes acceleration response with a length of 32 at the first internal node, $H_1$ and $H_2$ denote frequency response with a length of 32 at the first external node and the second external node respectively, $H_1$ denotes frequency response with a length of 32 at a first internal node, let a total acceleration response set be $\ddot{X}=\{\ddot{X}_k, \ddot{X}_u\}$, and let a total frequency response function set be $H=\{H^k, H^u\}$.

Step 3, a CNN model sequentially including an input layer, a=3 convolutional layers, 2 maximum pooling layers, e=4 fully connected layers, and an output layer may be constructed, a maximum pooling layer may be added between two adjacent convolutional layers, and a relu activation function may be used between the fully connected layers.

The $\ddot{X}_k$ as an input set may be input into the CNN, convolution and pooling may be sequentially performed by the 3 convolutional layers and the 2 maximum pooling layers that are cross-connected, and a feature vector with a dimension of b×c×d=128×256×3 may be output from a third convolutional layer.

A feature vector set with a dimension of 128×256×3 may be flattened, and a feature vector set with a dimension of b×c=128×256 may be obtained.

The feature vector set with the dimension of 128×256 may be sequentially processed by the 3 fully connected layers, and an internal node response prediction vector with a dimension of w×n=1×32 may be obtained and expressed as $\ddot{X}_{net}$.

Step 4, a difference function may be constructed.

Step 4.1: dimensionality reduction may be performed on acceleration response in $\ddot{X}_k$, Fourier transform may be performed, and an acceleration response matrix $\ddot{X}_k(w)$, $\ddot{X}_k(w)=[u_1(w), u_2(w)]^T$ of 2 external nodes on a frequency domain with a dimension of m×w=2×32 may be obtained, where $u_1(w)$ and $u_2(w)$ denote acceleration response on a frequency domain with a length of 32 at the first node and the second node, respectively.

Step 4.2, Fourier transform may be performed on $\ddot{X}_{net}$, and a prediction vector $\ddot{X}_{net}(w)$ of 1 internal response node on a frequency domain with a dimension of n×w=1×32 may be obtained, where $\ddot{X}_{net}(w)=[u_1'(w)]^T$, and $u_1'(w)$ denote acceleration response on a frequency domain with a length of 32 at the first internal node predicted by the network.

Step 4.3: a relation formula may be constructed between external node response and internal node response in structural dynamics by formula (1):

$$\begin{cases} \ddot{X}_{net}(w) = T_{aku}(\omega)\ddot{X}_k(\omega) \\ T_{aku}(\omega) = H^u(H^k)^+ \end{cases} \quad (1)$$

In formula (1), $T_{aku}(\omega)$ denotes a transfer matrix, pseudo-inverse multiplication may be performed on an acceleration frequency response function matrix $H^u$ of an internal node and an acceleration frequency response function matrix $H^k$ of an external node, a true acceleration response transfer matrix $T_{aku}(w)$ may be obtained and a difference f may be computed by formula (2):

$$f = \ddot{X}_{net}(w) - T_{aku}(\omega)\ddot{X}_k(w) \quad (2)$$

Step 4.4, pseudo-inverse multiplication may be performed on $\ddot{X}_{net}(w)$ and $\ddot{X}_k(w)$, and a predicted acceleration response transfer matrix $T_{net}(w)=[a_1(w), a_2(w)]$ may be obtained; where $a_1(w)$ and $a_2(w)$ denote acceleration response transfer functions with a length 32 at a first external node and a second external node, and a difference T may be computed by formula (3) by subtracting $T_{net}(w)$ from the true acceleration response transfer matrix $T_{aku}(\omega)$:

$$T = T_{net}(w) - T_{aku}(\omega) \quad (3)$$

Step 5: a total loss $L_{a11}$ of the CNN may be generated by formula (4):

$$L_{a11} = L_1 + L_2 + L_3 + L_4 \quad (4)$$

In formula (4), $L_1$ denotes a first loss and may be obtained by formula (5), $L_2$ denotes a second loss and may be obtained by formula (6), $L_3$ denotes a third loss and may be obtained by formula (7), and $L_4$ denotes a fourth loss and may be obtained by formula (8).

$$L_1 = (f - f_0)^T(f - f_0) \quad (5)$$

$$L_2 = (T - f_0)^T(T - f_0) \quad (6)$$

$$L_3 = (\ddot{X}_{net0} - \ddot{X}_0)^T (\ddot{X}_{net0} - \ddot{X}_0) \quad (7)$$

$$L_4 = (\ddot{X}_{net} - \ddot{X}_u')^T (\ddot{X}_{net} - \ddot{X}_u') \quad (8)$$

In formulas (5)-(8), $f_0$ denotes an all-zero matrix with a dimension of n×w=1×32, $\ddot{X}_{net0}$ denotes predicted response output by an acceleration response matrix under an initial condition through the CNN model, let the acceleration response matrix under the initial condition be an all-zero matrix with a dimension of w×1×m=32×1×2, and $\ddot{X}_0$ denotes acceleration response of $\ddot{X}_u$ under the initial condition.

Figure 2:
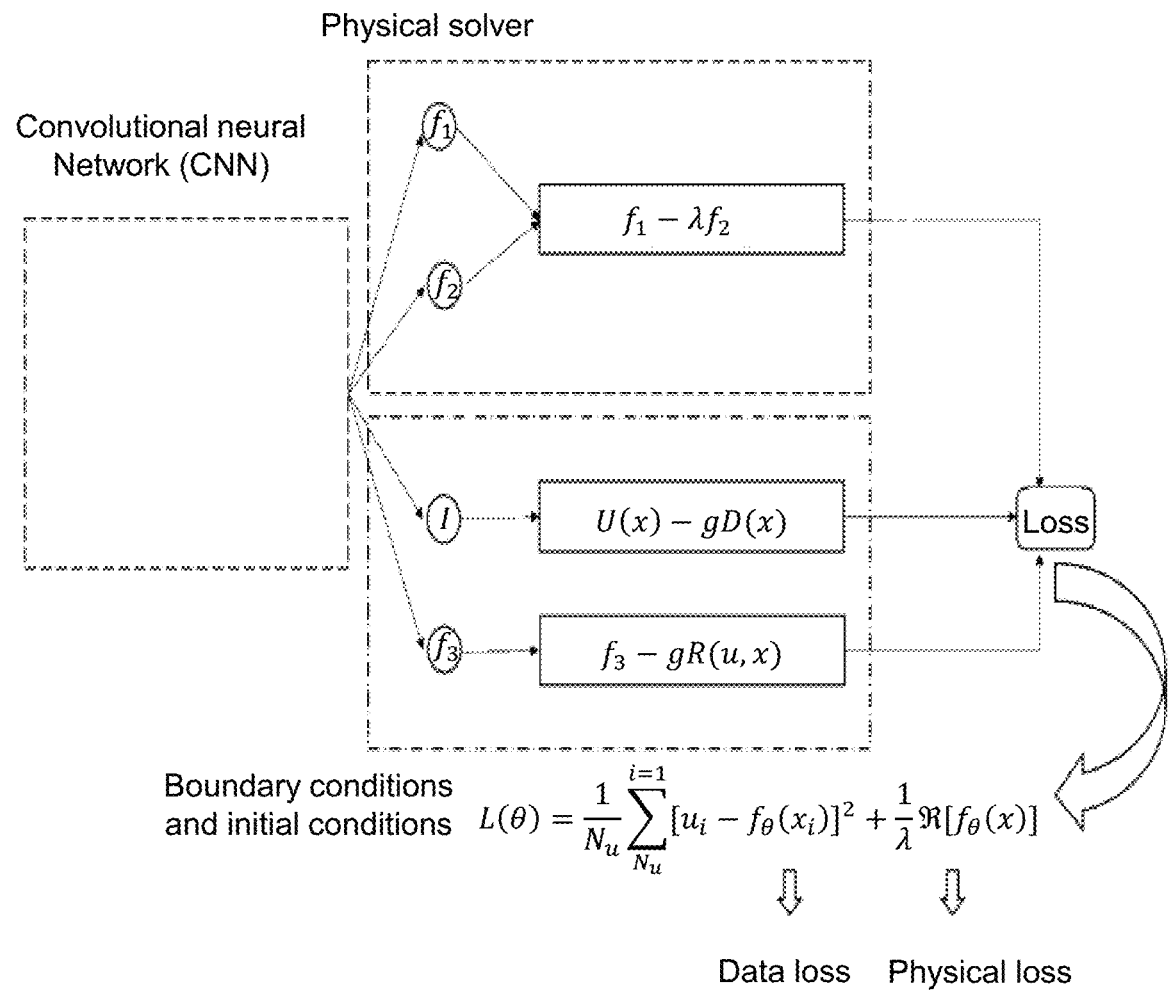
FIG. 2 is a schematic diagram illustrating a response reconstruction process of a method according to the present disclosure.

Step 5: based on the total acceleration response set $\ddot{X} = \{\ddot{X}_k, \ddot{X}_u\}$ and the total frequency response function set $H = \{H^k, H^u\}$, the CNN may be trained with an Adam optimizer, a total loss $L_{a11}$ may be computed and network parameters may be updated until a maximum training time is reached or the total loss $L_{a11}$ converges, a trained CNN may be obtained for reconstructing response of any internal node of the structure. A schematic diagram illustrating a response structure process may be found in FIG. 2.

The Example of the present disclosure provides an electronic device, including a memory and a processor. The memory may be configured to store programs supporting the processor in execution of the method. The processor may be configured to execute the programs stored in the memory.

The Example of the present disclosure provides a non-transitory computer-readable storage medium, storing computer programs that, when executed by a processor, may direct the processor to execute the steps pf the method.

Figure 3:
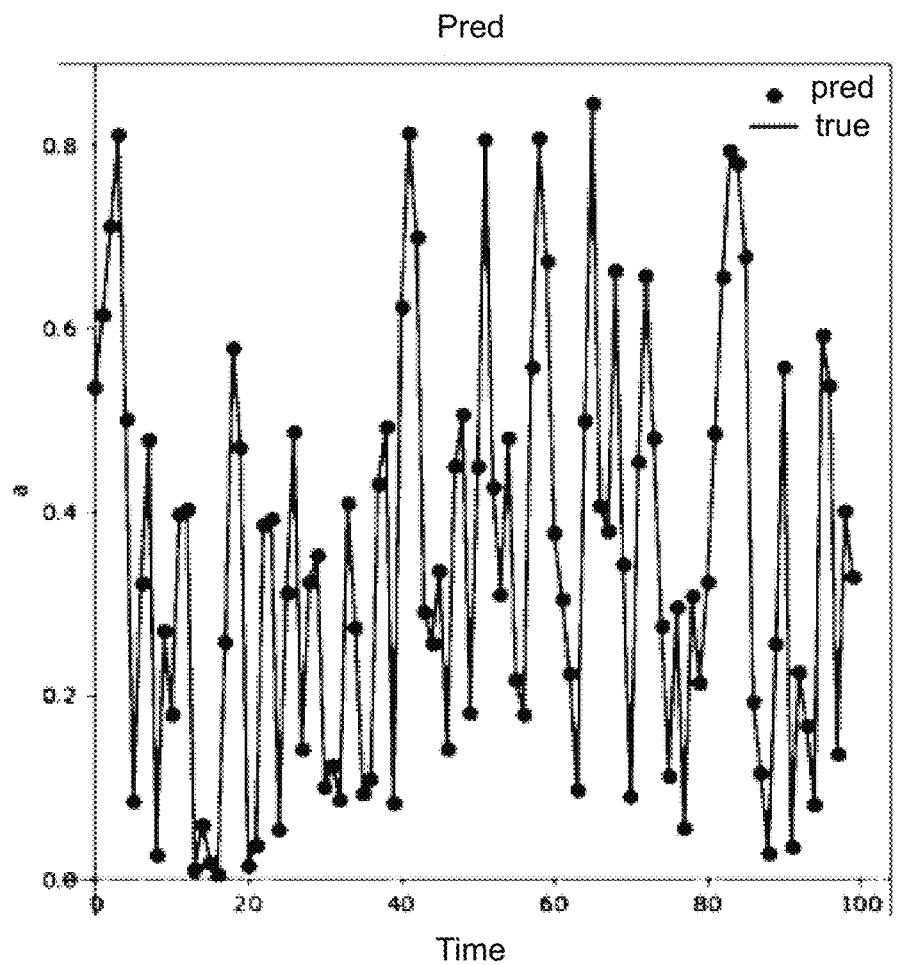
FIG. 3 is a diagram illustrating a comparison between a predicted value and a true value of internal response reconstruction of a simply supported beam bridge with a uniform section under random load excitation according to the present disclosure.
Figure 4:
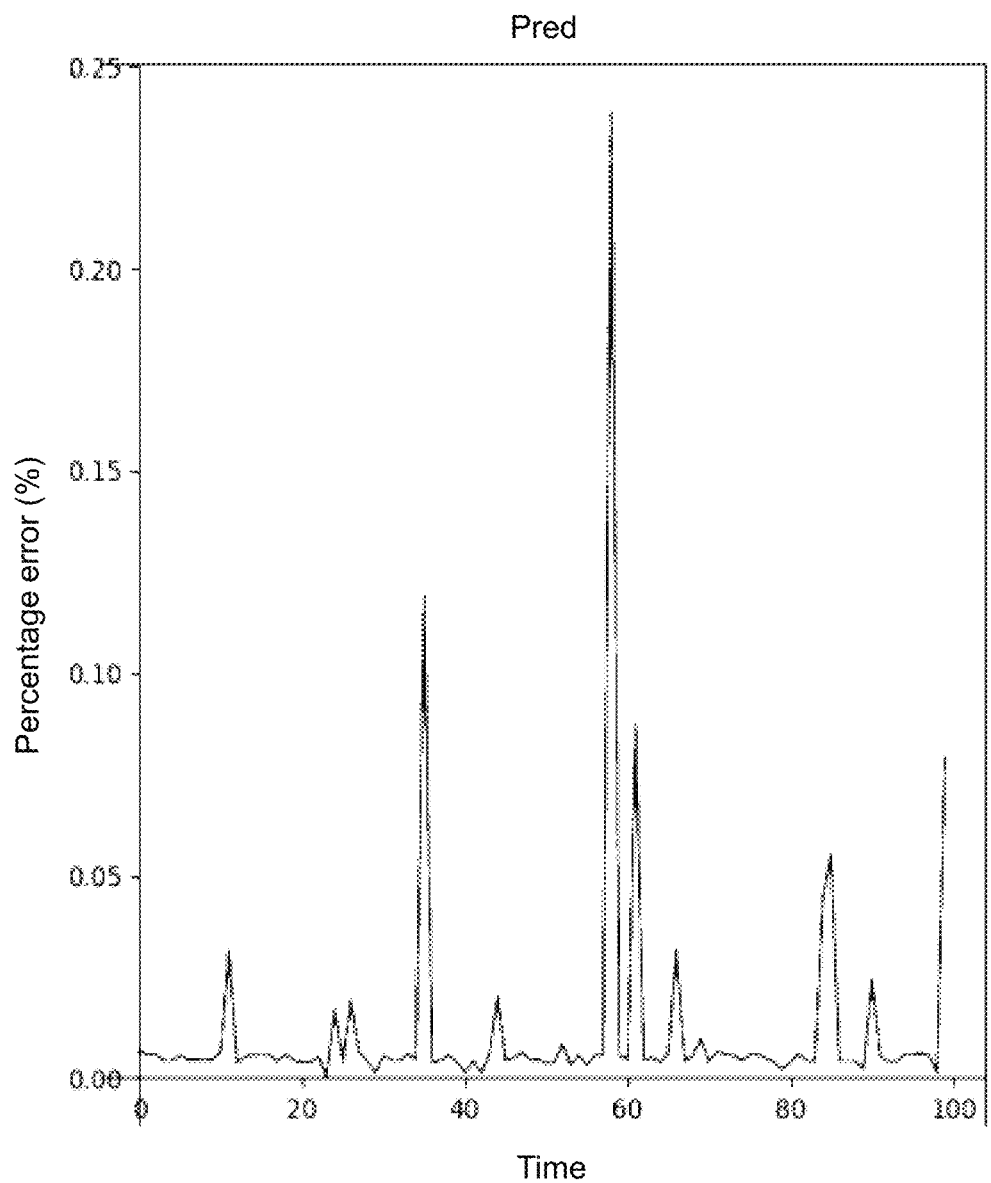
FIG. 4 is a diagram illustrating an error percentage of internal response reconstruction of a simply supported beam bridge with a uniform section under random load excitation according to the present disclosure.
Figure 5:
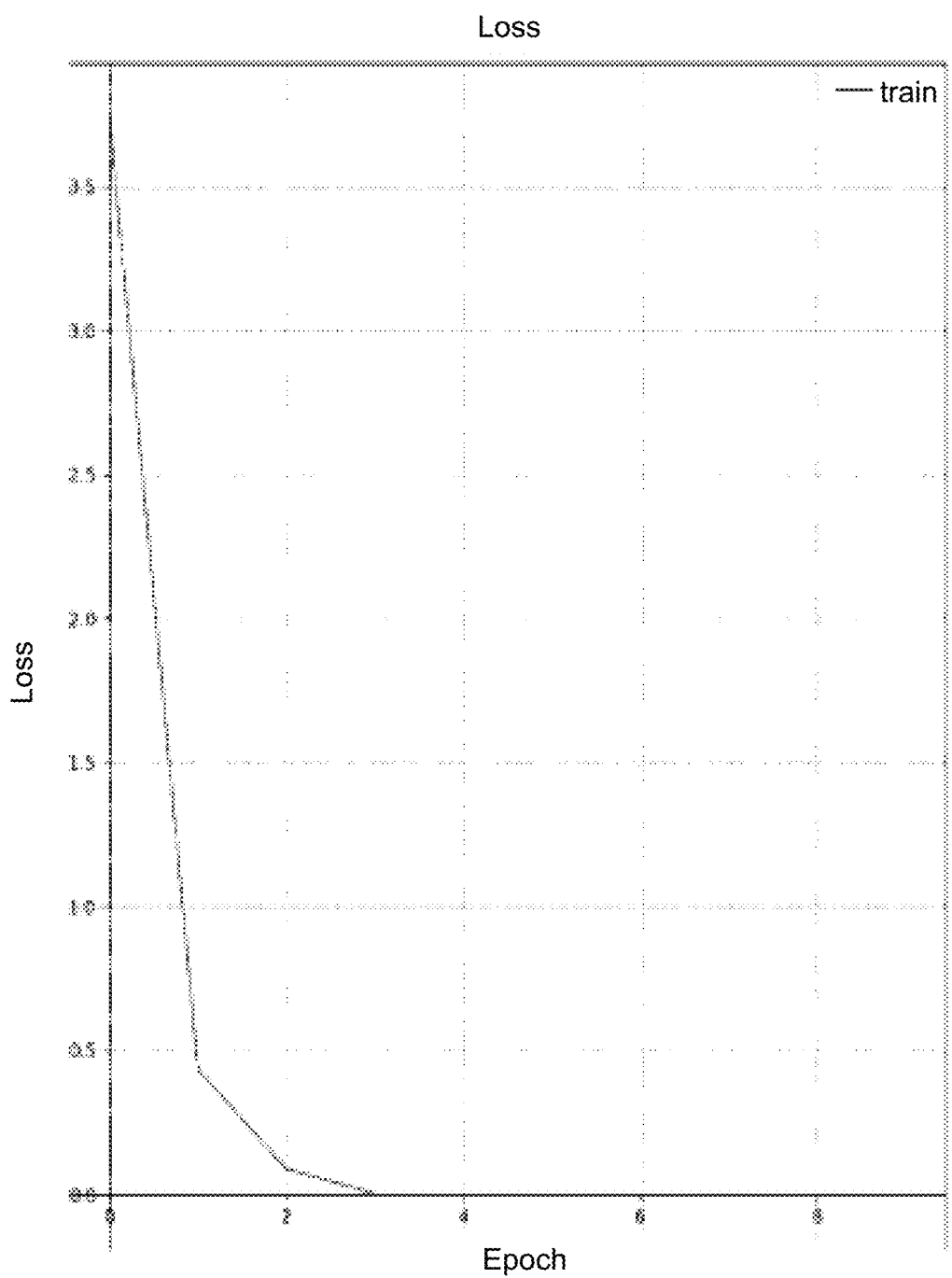
FIG. 5 is a diagram illustrating a loss function of internal response reconstruction of a simply supported beam bridge with a uniform section under random load excitation according to the present disclosure.

The comparison between some response results and true values of internal measurement points of the structure may be shown in Table 1 and FIGS. 3-4. The loss function may be shown in FIG. 5.

TABLE 1

| True value (m/s²) | Predicted value (m/s²) | Error (%) |
|---|---|---|
| 0.40386 | 0.40384 | 0.004 |
| 0.53375 | 0.53372 | 0.005 |

In Example 1, the bridge may have a span length of 50 m, a width and a height of 10 m, an elastic modulus of 21 Gpa, and a mass per linear meter of 7800 kg/m. When the finite element method is used for simulation, the bridge may be divided into hexahedral elements.

Figure 6:
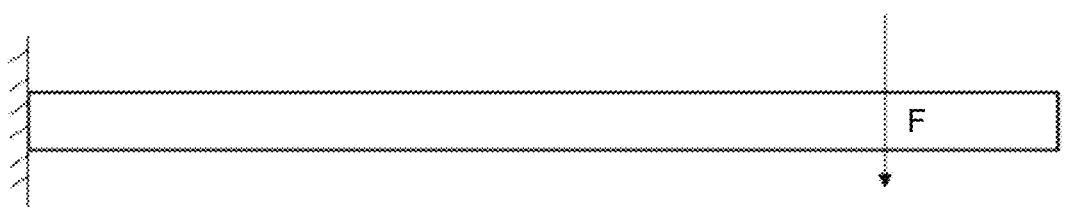
FIG. 6 is a schematic diagram illustrating a front view of a numerical simulated cantilever bridge model according to the present disclosure.
Figure 7:
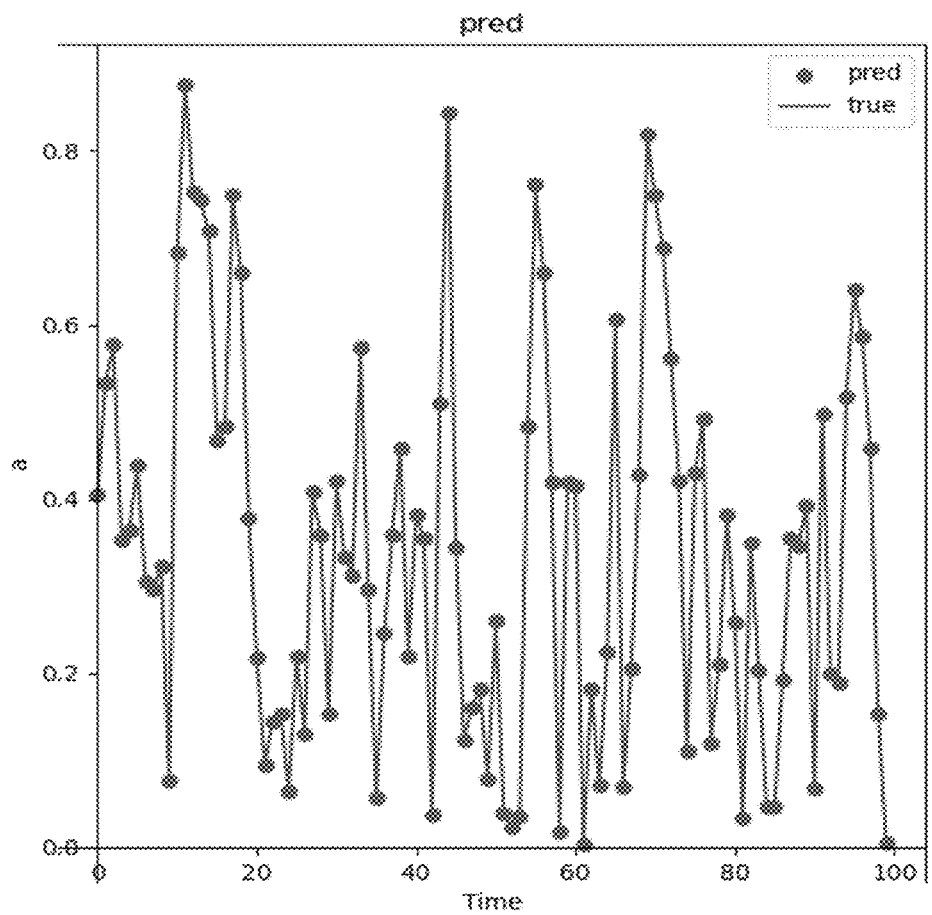
FIG. 7 is a diagram illustrating a comparison between a predicted value and a true value of internal response reconstruction of a cantilever bridge with a uniform section under random load excitation according to the present disclosure.
Figure 8:
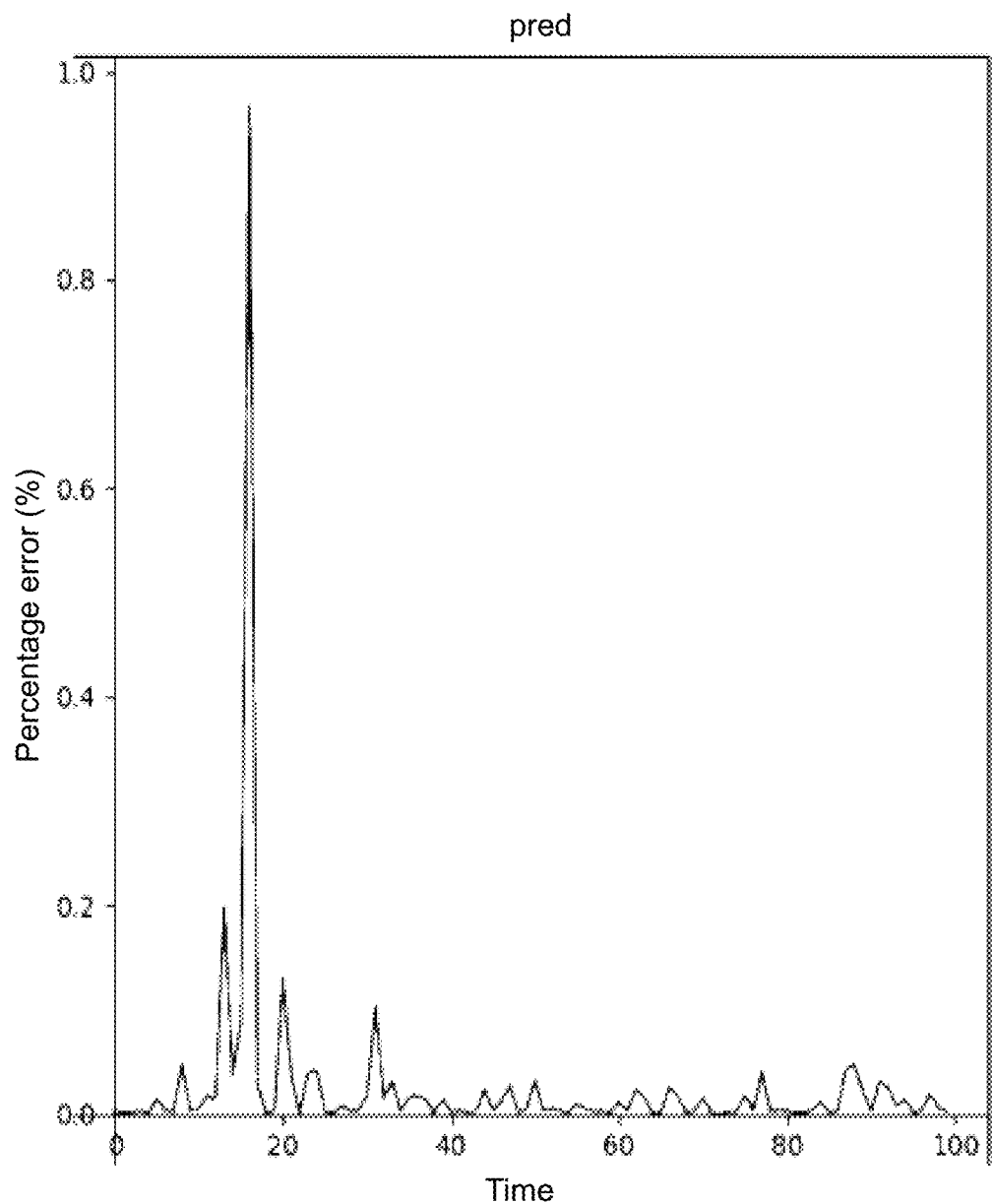
FIG. 8 is a diagram illustrating an error percentage of internal response reconstruction of a cantilever bridge with a uniform section under random load excitation according to the present disclosure.
Figure 9:
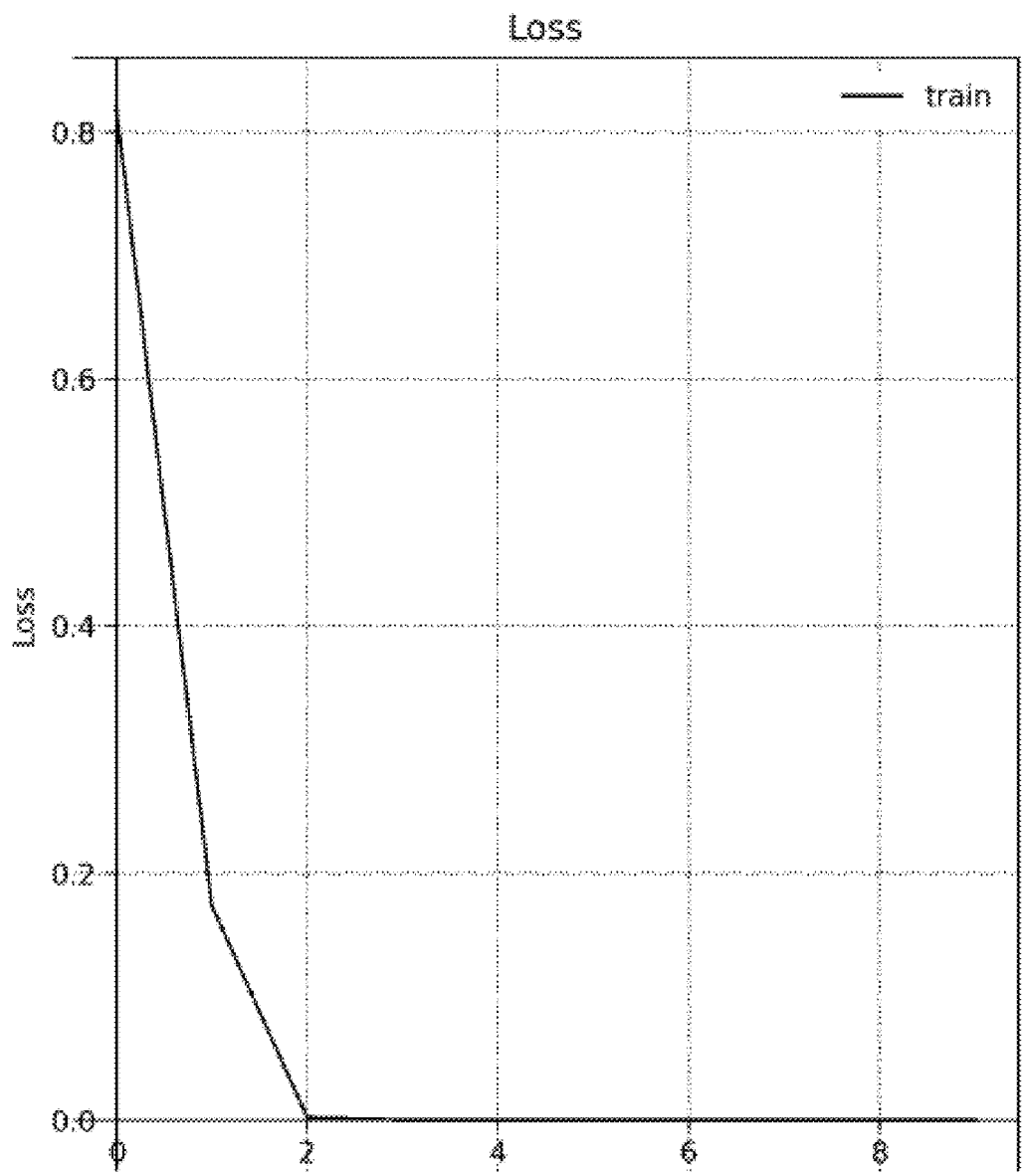
FIG. 9 is a diagram illustrating a loss function of internal response reconstruction of a cantilever bridge with a uniform section under random load excitation according to the present disclosure.

In Example 2, for a cantilever bridge model shown in FIG. 6, a bridge may have a span length of 50 m, a width and a height of 10 m, an elastic modulus of 21 Gpa, and a mass per linear meter of 7800 kg/m. When a finite element method is used for simulation, the bridge may be divided into hexahedral elements. A reconstruction method and a response reconstruction process may be the same as those in Example 1. The comparison between some response results and true values of internal measurement points of the structure may be shown in Table 2 and FIGS. 7-8. A loss function may be shown in FIG. 9.

TABLE 2

| True value (m/s²) | Predicted value (m/s²) | Error (%) |
|---|---|---|
| 0.00568 | 0.00569 | 0.17 |
| 0.63920 | 0.63924 | 0.006 |

From Table 1 and Table 2, it can be seen that the precision of the network may reach about 0.1% for prediction of the internal response of the bridge, and the network may have desirable performance in the case of different bridge types and complex loads. It can be seen from FIG. 5 and FIG. 9 that the network may converge quickly with few training times, thereby shortening training time. To sum up, the method can better predict the internal response of the bridge under the condition of insufficient data and the complex load.

What is claimed is:

1. A dual physically-driven and data-driven method for reconstructing internal response of a bridge, the method comprising:

step 1, arranging sensors on m nodes of the bridge, respectively, wherein the sensors are configured to collect acceleration response of the bridge, wherein m is positive integers, and m denotes number of external node;

step 2, modeling the bridge by utilizing a finite element model to obtain the finite element model of the bridge, applying a random load to the finite element model of the bridge, and obtaining an acceleration response matrix $\ddot{X}_k = [u_1, u_2, \ldots, u_i, \ldots, u_m]^T$ of m external nodes and a frequency response function matrix $H^k = [H_1, H_2, \ldots, H_i, \ldots, H_m]^T$ thereof, and an acceleration response matrix $\ddot{X}_u = [u_1', u_2', \ldots u_j', \ldots u_n']^T$ of n internal nodes of the bridge and a frequency response function matrix $H^u = [H_1', H_2', \ldots H_j', \ldots H_n']^T$ thereof, wherein $u_i$ denotes acceleration response with a length of w at an $i^{th}$ external node, $u_j'$ denotes acceleration response with a length of w at a $j^{th}$ internal node, $H_i$ denotes frequency response with a length of w at an $m^{th}$ external node, $H_j$ denotes frequency response with a length of w at a $n^{th}$ internal node, n denotes number of internal node, w denotes length, n and w are positive integers, let a total acceleration response set be $\ddot{X} = \{\ddot{X}_k, \ddot{X}_u\}$, and let a total frequency response function set be $H = \{H^k, H^u\}$;

step 3, constructing a convolutional neural network (CNN) model sequentially, the CNN model comprising an input layer, convolutional layers with a-layer, maximum pooling layers with (a−1)-layer, fully connected layers with e-layer, wherein a and e are positive integers, and an output layer, adding a maximum pooling layer between two adjacent convolutional layers, and utilizing a relu activation function between the fully connected layers;

inputting $\ddot{X}_k$ as an input set into the CNN model, sequentially performing convolution and pooling by the convolutional layers and the maximum pooling layers that are cross-connected, and outputting a feature vector with a dimension of b×c×d from an $a^{th}$ convolutional layer; wherein b, c, and d are positive integers, b denotes a number of channels for signal input, c denotes a number of channels for convolution generation, and d denotes a size of a convolution kernel;

flattening a feature vector set with the dimension of b×c×d, and obtaining a feature vector set with a dimension of b×c; and sequentially processing the feature vector set with the dimension of b×c by the fully connected layers, and obtaining an internal node response prediction vector with a dimension of w×n expressed as $\ddot{X}_{net}$;

step 4, constructing a difference function;

step 4.1: performing dimensionality reduction on acceleration responses in $\ddot{X}_k$, performing Fourier transform, and obtaining acceleration response matrices $\ddot{X}_k(w) = [u_1(w), u_2(w), \ldots, u_i(w), \ldots u_m(w)]^T$ of m external nodes on a frequency domain with a dimension of m×w, wherein $u_i(w)$ denotes acceleration response on a frequency domain with a length of w at an $i^{th}$ node;

step 4.2, performing Fourier transform on $\ddot{X}_{net}$, and obtaining a prediction vector $\ddot{X}_{net}(w)=[u_1'(w), u_2'(w), \ldots, u_j'(w), \ldots, u_n'(w)]^T$ of n internal response nodes on a frequency domain with a dimension of n×w, wherein $u_j'(w)$ denotes acceleration response on a frequency domain with a length of w at a $j^{th}$ internal node predicted by the CNN mode;

step 4.3: constructing a relation formula between external node response and internal node response in structural dynamics by formula (1):

$$\begin{cases} \ddot{X}_{net}(w) = T_{aku}(\omega)\ddot{X}_k(\omega) \\ T_{aku}(\omega) = H^u(H^k)^+ \end{cases} \quad (1)$$

wherein in formula (1), $T_{aku}(\omega)$ denotes a transfer matrix, performing pseudo-inverse multiplication on an acceleration frequency response function matrix $H^u$ of an internal node and an acceleration frequency response function matrix $H^k$ of an external node, obtaining a true acceleration response transfer matrix $T_{aku}(w)$, and computing a difference f by formula (2):

$$f=\ddot{X}_{net}(w)-T_{aku}(\omega)\ddot{X}_k(w) \quad (2)$$

step 4.4, performing pseudo-inverse multiplication on $\ddot{X}_{net}(w)$ and $\ddot{X}_k(w)$, and obtaining a predicted acceleration response transfer matrix $T_{net}(w)=[a_1(w), a_2(w), \ldots, a_j(w), a_m(w)]$; wherein $a_j(w)$ denotes an acceleration response transfer function with a length n at a $j^{th}$ external node; and computing a difference T by formula (3):

$$T=T_{net}(w)-T_{aku}(\omega) \quad (3)$$

step 5: generating a total loss $L_{a11}$ of the CNN model by formula (4):

$$L_{a11}=L_1+L_2+L_3+L_4 \quad (4)$$

wherein in formula (4), $L_1$ denotes a first loss and is obtained by formula (5), $L_2$ denotes a second loss and is obtained by formula (6), $L_3$ denotes a third loss and is obtained by formula (7), and $L_4$ denotes a fourth loss and is obtained by formula (8);

$$L_1=(f-f_0)^T(f-f_0) \quad (5)$$

$$L_2=(T-f_0)^T(T-f_0) \quad (6)$$

$$L_3=(\ddot{X}_{net0}-\ddot{X}_0)^T(\ddot{X}_{net0}-\ddot{X}0) \quad (7)$$

$$L_4=(\ddot{X}_{net}-\ddot{X}_u')^T(\ddot{X}_{net}-\ddot{X}_u') \quad (8)$$

wherein in formulas (5)-(8), $f_0$ denotes an all-zero matrix with a dimension of n×w, $\ddot{X}_{net0}$ denotes predicted response output by an acceleration response matrix under an initial condition through the CNN model, let the acceleration response matrix under the initial condition be an all-zero matrix with a dimension of w×1×m, and $\ddot{X}_0$ denotes acceleration response of $\ddot{X}_u$ under the initial condition; and step 6: based on the total acceleration response set $\ddot{X}=\{\ddot{X}_k, \ddot{X}_u\}$ and the total frequency response function set $H=\{H^k, H^u\}$, training the CNN model with an Adam optimizer, computing a total loss $L_{a11}$ and updating parameters of the CNN model until a maximum training time is reached or the total loss $L_{a11}$ converges, and obtaining a trained CNN model for reconstructing response of any internal node of the bridge.

2. An electronic device, comprising a memory and a processor, wherein the memory is configured to store programs supporting the processor in execution of a method for reconstructing internal response of a bridge according to claim 1, and wherein the processor is configured to execute the programs stored in the memory.

3. A non-transitory computer-readable storage medium, storing computer programs that, when executed by a processor, the computer programs direct the processor to execute steps of a method for reconstructing internal response of a bridge according to claim 1.

* * * * *